United States Patent [19]

Smith

[11] 3,996,603

[45] Dec. 7, 1976

[54] RF POWER SEMICONDUCTOR PACKAGE AND METHOD OF MANUFACTURE

[75] Inventor: John Marvin Smith, Glen Ellyn, Ill.

[73] Assignee: Motorola, Inc., Schaumburg, Ill.

[22] Filed: Oct. 18, 1974

[21] Appl. No.: 516,054

[52] U.S. Cl. .................................. 357/80; 357/51; 357/68; 357/71; 357/74; 357/81

[51] Int. Cl.² .................. H01L 39/02; H01L 27/02; H01L 23/48; H01L 23/02

[58] Field of Search ................. 357/80, 51, 68, 71, 357/74, 81

[56] References Cited

UNITED STATES PATENTS

| | | | |
|---|---|---|---|
| 3,387,190 | 6/1968 | Winkler | 357/80 |
| 3,478,161 | 11/1969 | Carley | 357/80 |
| 3,628,105 | 12/1971 | Sakai et al. | 357/80 |

*Primary Examiner*—Edward J. Wojciechowicz
*Attorney, Agent, or Firm*—James W. Gillman; Victor Myer; Phillip H. Melamed

[57] ABSTRACT

High frequency power transistor carriers are made by bonding a metalized ceramic base to a lead frame strip, cutting the lead frame strip to isolate the base and collector leads while still maintaining the transistor carriers in strip form, and subsequently gold plating the resultant structure. Transistor dice are then attached to each ceramic carrier, and each transistor carrier in the strip is then electrically tested. The individual carriers are then separated from the lead frame strip. The individual carrier has wide base and collector leads extending outward from the ceramic base for a substantial distance and then the base and collector leads are narrowed down. When the individual transistor carrier is used in combination with a hybrid assembly, a reduction in lead inductance and total hybrid package size is obtained while exact carrier placement relative to the hybrid assembly is not required.

8 Claims, 8 Drawing Figures

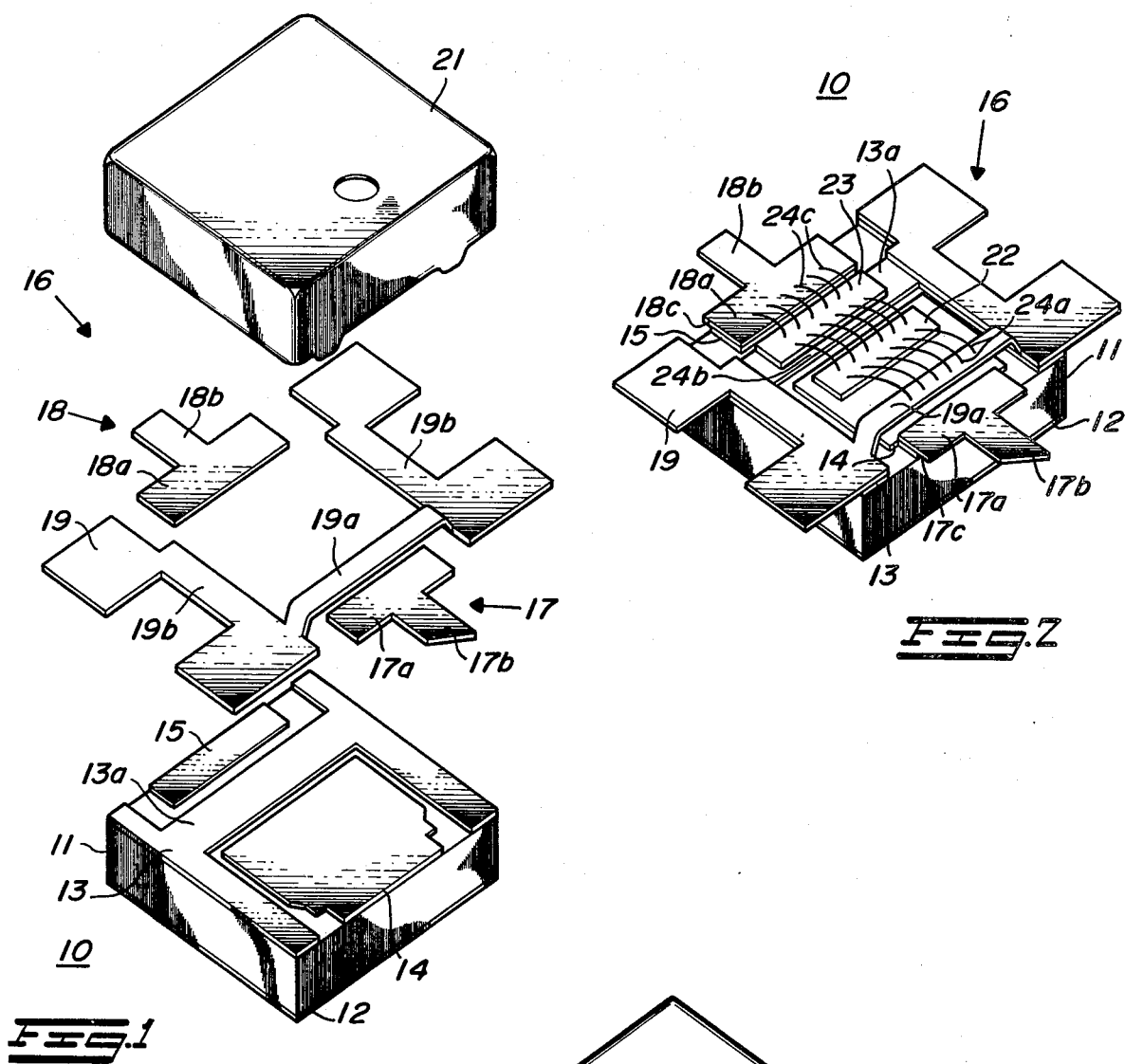
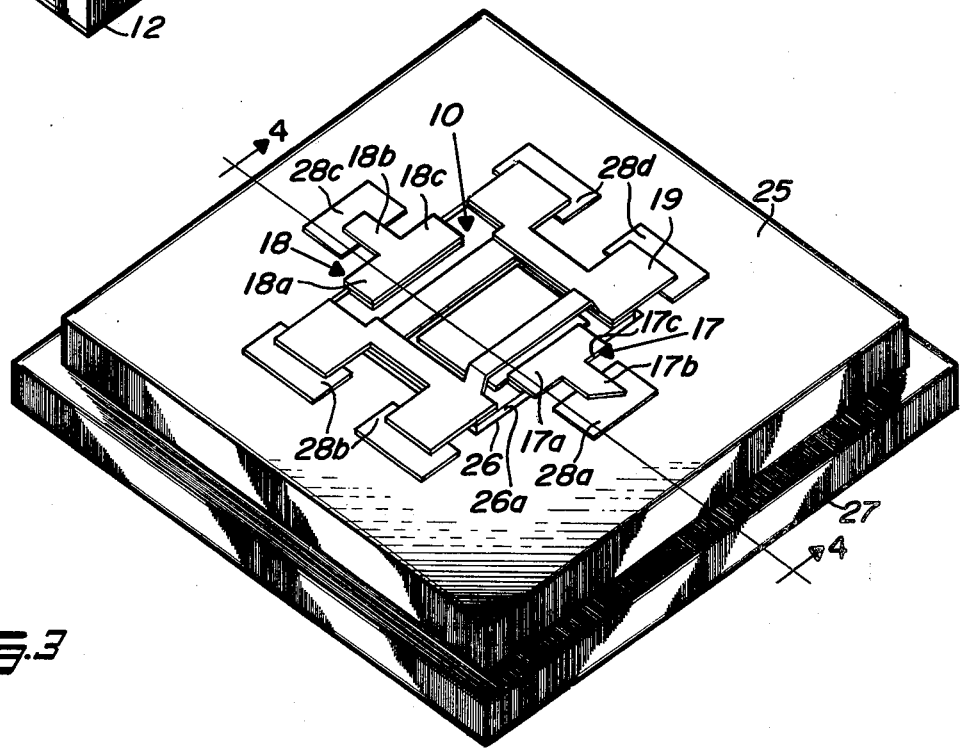
FIG.1
FIG.2
FIG.3

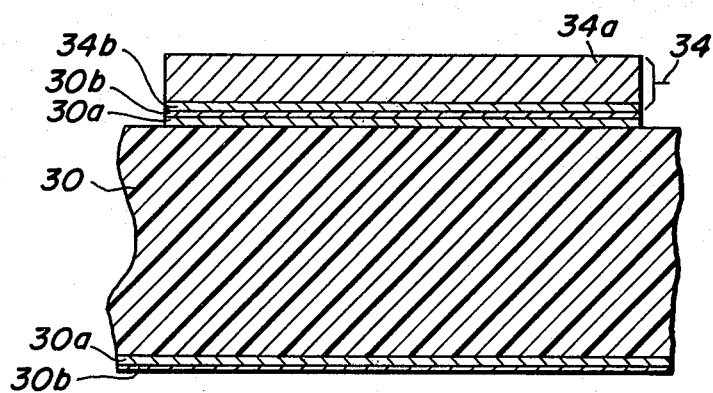
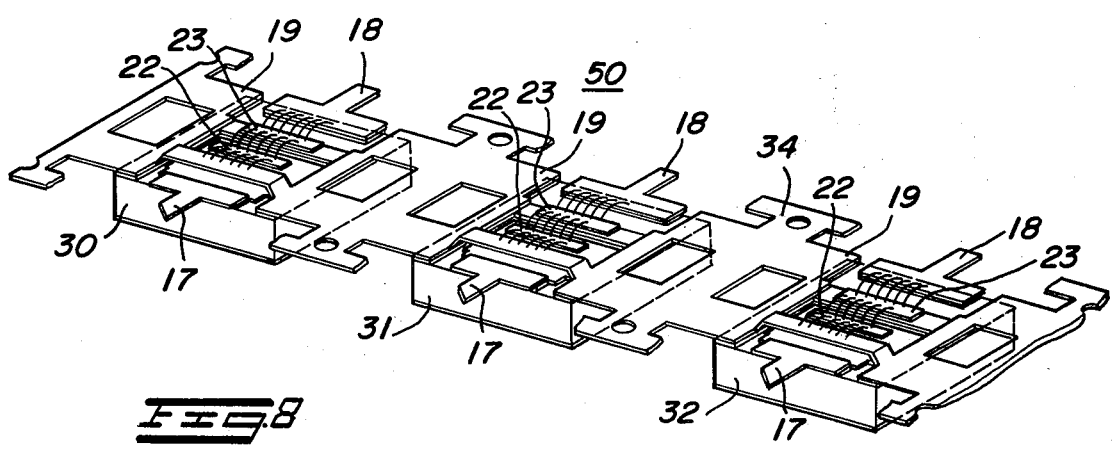

RF POWER SEMICONDUCTOR PACKAGE AND METHOD OF MANUFACTURE

BACKGROUND OF THE INVENTION

The invention relates to high frequency power semiconductor packages and the method of construction of such packages. Power transistor packages normally have a metallic flange brazed to the back of a circular ceramic carrier and the metallic flange is then mechanically attached to a large heat sink. The metallic flange can either be in the form of a threaded stud or a flat metallic body having through holes for mounting the metallic body to a heat sink. High frequency transistors have wide base, collector, and emitter leads in order to reduce any lead inductive effects and such leads are normally made as wide as possible.

The use of a metallic flange brazed to the bottom of the ceramic carrier makes power transistor packages bulky and unsuitable for use in hybrid assemblies.

The term hybrid assemblies as used herein refers to conductively and resistively metalized substrates (normally ceramic) to which transistor packages as well as other components are mounted to form a compact electronic module.

High powder transistor dice are normally not directly mounted on the hybrid substrate because the substrate does not have a sufficiently high thermal conductivity and for repairability considerations. The large wide leads of high frequency packages waste space in hybrid assemblies and/or result in secondary lead cutting operations being necessitated. The wide external transistor leads also result in a large amount of gold being used since all external transistor leads are usually gold plated.

The normally used method of manufacturing high frequency power transistor packages consists of metalizing a circular ceramic package such that the top metalized layer is substantially gold, and bonding a gold plated kovar lead frame to the metalized areas on the ceramic carrier, usually with the use of a preform to insure a good bond. The individual transistor packages are then isolated from the lead frame and subsequently semiconductor dice are mounted and individually electrically tested. Thus individual handling of transistor packages before electrical testing is required. Also several individual components of the transistor package are separately metalized with gold before final assembly of the package. Gold is used because; it forms a eutectic with silicon to aid in mounting silicon semiconductor dice, it is compatible with present wire bonding techniques, and it provides a solderable non-corroding coating for the external leads.

SUMMARY OF THE INVENTION

An object of the present invention is to provide an improved semi-conductor power package for use in hybrid circuits and the like.

Another object of the invention is to provide an improved method of constructing semiconductor packages.

Still another object of the invention is to provide an improved method for packaging and testing semi-conductor devices.

In one embodiment of the present invention a power semiconductor package for use in hybrid assemblies is provided which includes: a ceramic base having a top surface, a flat bottom surface parallel to the top surface, and a thickness; a solderable electrically and thermally conductive bottom metalization bonded to and substantially covering all of the bottom ceramic surface; an electrically conductive top metalization bonded to said top ceramic surface and forming a plurality of top metalized areas, each of the plurality of metalized areas being isolated from each other; a plurality of metal leads bonded to the plurality of top metalized areas and including finger projections of a first width extending from each of at least two of the plurality of metalized areas outward and substantially beyond the edge of the ceramic base and the finger projections extending further outward with a second narrower width; and a semiconductor chip mechanically mounted to the ceramic top surface. When the power semi-conductor package is connected to a heat sink through a hole in a hybrid ceramic substrate, the wider portions of the strip fingers reduce the lead inductance of the semi-conductor package while the narrower strip finger portions are bonded to the hybrid substrate and save metalization space on the hybrid substate. The reduction in the lead size is also economical since the leads are gold plated.

A method for manufacturing semiconductor device packages which has only one gold metalizing step is described and comprises the steps of; metalizing the bottom surface and a plurality of top surface areas on a series of ceramic carriers with a gold free metalization, bonding a number of separate finger projections of a silver clad nickel lead frame strip to the top metalized areas on the series of ceramic carriers, and gold plating the bonded lead frame strip and bonded top metalized areas on the series of ceramic carriers. Thus a single gold metalizing operation is used and the need for a lead frame bonding preform is eliminated.

After the bonding step, the input and output leads of the carriers are isolated from the head frame strip while maintaining a number of finger projections intact so that the individual carriers remain in strip form. After plating, semiconductor devices are mounted on each of the ceramic carriers and appropriate electrical connections from the devices to lead frame fingers are made. The individual devices are then electrically tested while still in strip form and then separated from the lead frame strip.

BRIEF DESCRIPTION OF THE DRAWINGS

For a more complete understanding of the invention reference should be made to the drawings in which:

FIG. 1 is an exploded view of a single semiconductor carrier;

FIG. 2 is a detailed partial assembly view of a single carrier;

FIG. 3 is a top assembly view showing a carrier mounted in a hybrid circuit;

FIG. 6 is a cross sectional view of the assembly shown in FIG. 5 taken along line 6—6;

FIG. 8 is the assembly of FIG. 7 shown with electrical components attached and ready for testing individual carriers.

DETAILED DESCRIPTION OF THE INVENTION

Figure 4:
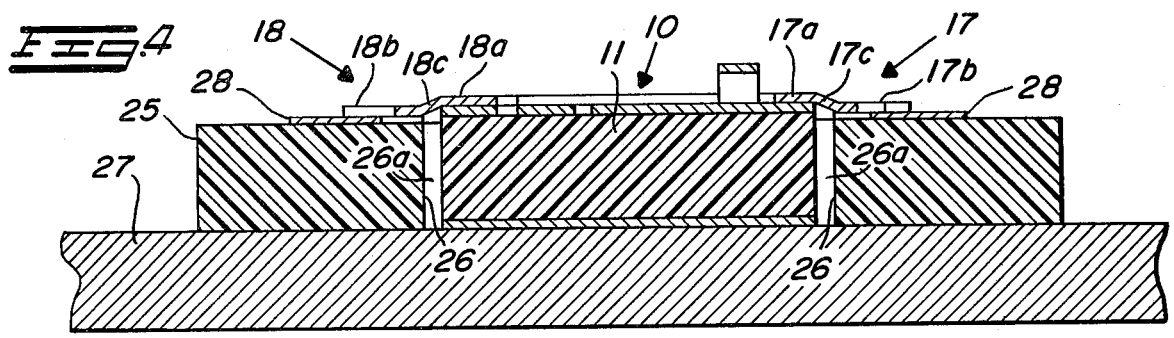
FIG. 4 is a cross sectional view of the assembly shown in FIG. 3 taken along line 4—4.

FIG. 1 shows a high frequency power transistor package 10 in an exploded view form. For clarity no semiconductor component is shown in FIG. 1. The transistor package 10 consists of a relatively thin solid rectangular block ceramic base 11 having a solderable base metalization 12 which substantially covers the entire bottom surface of ceramic base 11. The top surface of ceramic base 11 has bonded to it, a metalization 13 defining a generally H-shaped top metalization area having a cross bar area 13a, a metalization 14 forming a large generally rectangular area bounded by the cross bar 13a and two leg areas of metalization 13, and a metalization 15 forming a small generally rectangular area bounded by the cross bar 13a and the two other leg areas of metalization 13.

Metalizations 12, 13, 14 and 15 preferably consist of a moly-manganese (molydenum-manganese) base metalization with a nickel flash overcoat and therefore represent solderable gold free metalizations bonded to ceramic base 11.

A plurality of metal leads generally referred to as 16 is shown as consisting of three separated metal finger members 17, 18 and 19 which are to be bonded to top metalizations 13, 14 and 15. A flat metal lead finger generally referred to as 17, (which is to be bonded to metalization 14), is shown as consisting of a flat rectangularly shaped member 17a, having a relatively large width attached to a flat generally rectangularly shaped member 17b having a relatively narrow width. Member 17b forms an outwardly facing projection with respect to the center of the top surface of ceramic base 11, and 17b will function as a device lead. A flat metal finger projection generally referred to as 18, which is to be bonded to metalization 15, is shown as consisting of a member 18a and a member 18b constructed similarily to members 17a and 17b respectively, with member 18b forming an outwardly facing projection which is to serve as an external device lead. Member 17b is shown having an oblique end cut section for lead identification purposes. A lead frame member 19 is shown as a generally H-shaped member having an elevated nonplanar cross bar 19a, and legs 19b which are to be bonded to the legs of H-shaped metalization 13. The leads 16 are preferably nickel having a silver clading on the areas of the lead frame members which are to be bonded to top metalizations 13, 14 and 15. A cover 21 is shown as a ceramic hollow rectangularly shaped cap which is to be mounted to ceramic base 11 for protecting any semiconductor devices mounted in semiconductor package 10.

FIG. 2 shows a detailed partial assembly view of semiconductor carrier 10 without the protective cover 21, but with a semiconductor device mounted on the top surface of ceramic base 11. Member 17 is shown bonded to metalization 14 such that a portion 17c of the length of member 17a extends outward substantially beyond the edge of ceramic base 11 and member 17b forms a further outward extension having a second narrower width. Member 18 is shown bonded similarily to metalization 15 with member 18b similarily forming a further outward extension at a narrower width than a member 18c which is an outward extending portion of member 18a. Member 19 is shown bonded to the legs of H-shaped metalization 13 with the elevated cross bar 19a forming a bridge across top metalization 14. A high frequency RF interdigitated power transistor chip 22 in shown mounted to top metalization 14 and an MOS capacitor 23 is shown mounted to the cross bar 13a of metalization 13. It is understood that before components 22 and 23 are mounted to their respective top metalizations, the top metalizations have been gold plated as will be discussed later on. A series of wire bonds 24a is shown connecting the multiple interdigitated emitter fingers of chip 22 to the cross bar 19a. A series of wire bonds 24b is shown connecting the multiple interdigitated base fingers of chip 22 to MOS capacitor 23 and a series of wire bonds 24c is shown connecting MOS capacitor 23 to lead frame member 18a. The use of an MOS capacitor in a transistor package and connected as described is known in the art and is described in U.S. Pat. No. 3,713,066. Projection 17b represents the collector lead of the packaged semiconductor device, projection 18b represents the base lead of the packaged semiconductor device, and outward projections of member 19 represent the emitter lead of the packaged semiconductor device. Because lead members 17 and 18 extend outward at a first relatively large width and then at a second relatively narrow width a considerable saving in hybrid substrate area is obtained while minimizing inductance effects as can be seen by referring to FIG. 3. in addition, the reduction in external lead width will reduce the cost of transistor package 10 since a smaller gold plated lead is used.

FIG. 3 shows a ceramic substrate 25, which has an internal rectangularly shaped through cavity 26 slightly larger than ceramic base 11, mounted to a heat sink 27. The semiconductor package 10 (shown in FIG. 2) is shown mounted on heat sink 27 through the internal cavity 26 in substrate 25 and is shown having its external lead projections 17, 18 and 19 mounted to a number of top surface metalizations 28a, b, c and d substrate 25. Since cavity 26 is larger than ceramic base 11, air gap space 26a will exist over which the external lead projections 17, 18, and 19 must cross. In FIG. 3 the extensions 17c and 18c of relatively wide members 17a and 18a are shown to be of such length that they bridge any possible existing air gaps 26a which are present between the side walls of ceramic base 11 and the inside walls of cavity 26.

FIG. 4 shows a cross sectional side view taken along line 4—4 to illustrate this fact. The relatively wide members 17c and 18c form relatively low inductance bridges connecting hybrid substrate 25 and semiconductor package 10 and make the electrical connection of semiconductor package 10 substantially independent of the mounting position of package 10 relative to cavity 26. In FIGS. 3 and 4 the hybrid substrate 25 and the semiconductor package carrier 10 are assumed to be soldered to heat sink 27. Once external leads 17 and 18 of carrier 10 extend over the ceramic material of hybrid substrate 25, their effect on parasitic lead inductance is minimized by the higher dielectric constant of ceramic substrate 25. The relatively wide members 17a and 18a need extend only beyond the edge of ceramic base 11 such that regardless of how carrier 10 is centered in cavity 26. In this manner, a wide low inductance lead will bridge any air gap 26a present between the side wall of ceramic base 11 and the interior walls of cavity 26. By narrowing the lead extensions of 17 and 18 after a sufficient extension beyond the edge of ceramic base 11 by a wide lead, a considerable savings in available metalization area on substrate 25 and in material cost for transistor carrier 10 can be realized.

Figure 5:
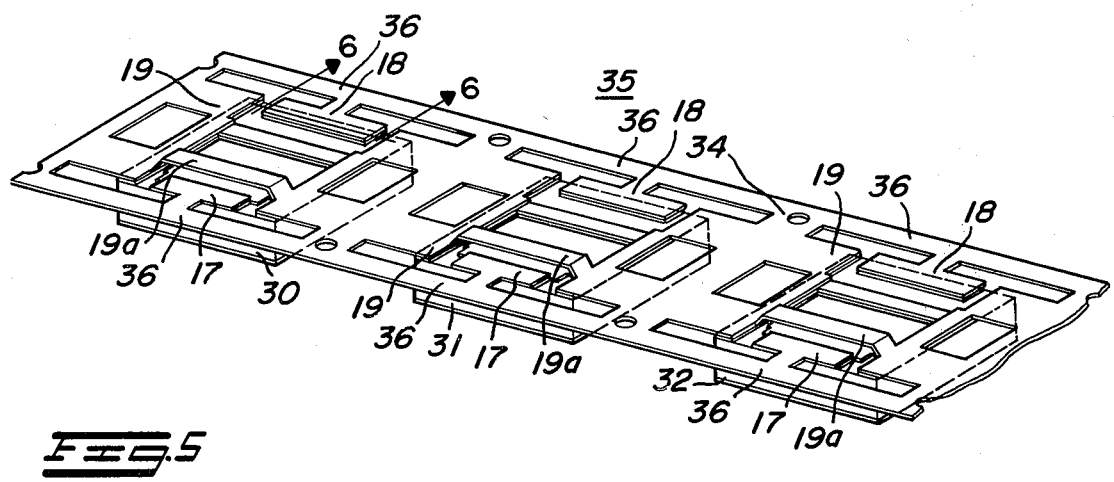
FIG. 5 is an assembly drawing showing a lead frame strip bonded to a number of ceramic carriers.

FIG. 5 ahows three metalized ceramic substrates 30, 31, and 32 all bonded to a single lead frame strip 34 forming a strip assembly 35. The metalization patterns on each of ceramic substrates 30, 31, and 32 are identical to the metalization patterns on ceramic base 11 (shown in FIG. 1) and will therefore not be described in detail. The lead frame strip 34 consists of three sets of individual lead frame projections corresponding to finger members 17, 18 and 19 (shown in FIG. 1.) and bonded to corresponding metalizations on ceramics 30, 31, and 32. Lead frame strip 34 extends as a strip in the direction of the cross bar 19a of the H-shaped members 19 and members 17 and 18 of each lead set are attached to side long support members 36 which are parallel to the cross bar 19a of the H-shaped members 19 of each lead set. The assembly of each lead set of strip 34 to each ceramic substrate 30, 31, and 32 is identical to the assembly of leads 16 to ceramic 11 as shown and described in FIGS. 1 and 2.

FIG. 6 is a cross sectional view taken along line 6—6 in FIG. 5 showing various metal layers. FIG. 6 shows lead frame 34 consisting of a nickel base 34a and a silver clading 34b. The silver clading 34b is bonded to the metalization on substrate 30 which consists of a molymanganese layer 30a having an exterior nickel overcoat 30b.

Figure 7:
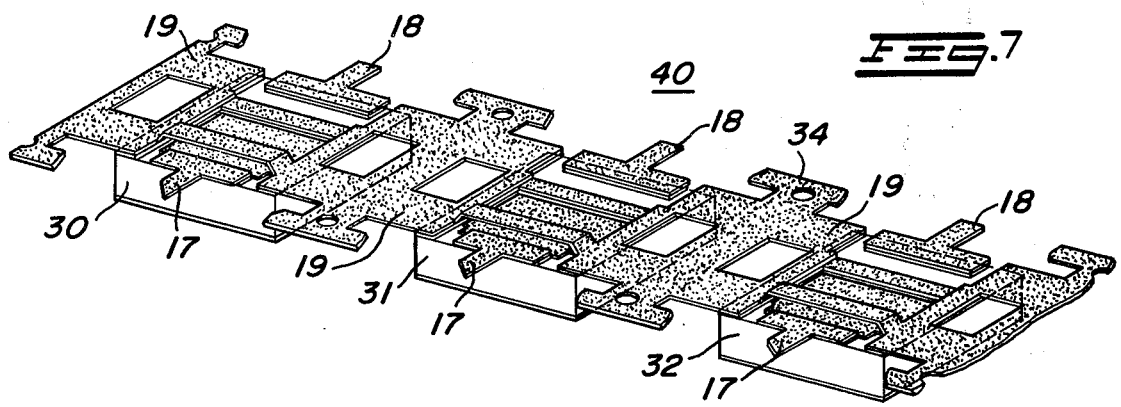
FIG. 7 is the assembly of FIG. 5 shown after isolating input and output leads and after subsequent gold plating.

In FIG. 7 an assembly 40 is shown as comprising the assembly 35 shown in FIG. 5 having the leads 17 and 18 of each of the three lead sets of assembly 35 isolated from lead frame strip 34, and having a gold plating (shown stippled) on lead frame strip 34 and the metalization patterns on substrates 30, 31, and 32.

FIG. 8 shows an assembly 50 having a transistor 22 and an MOS capacitor 23 mounted to each of substrates 30, 31, and 32 in assembly 40 (shown in FIG. 7) to form three transistor carriers each identical to carrier 10 shown in FIG. 4 and each attached to lead frame 34.

The inventive manufacturing process for the semiconductor package can now be explained more fully. A thin nickel metal strip 34a having silver clading 34b applied to one side of the metal strip, is punched out to form a lead frame strip 34 (shown in FIG. 5 and previously described which contains multiple arrays of finger projections 17, 18, and 19. The silver clading 34b is preferably applied by rolling it on to the nickel base 34a. The elevation of cross cross bar 19a of the H-shaped members 19 is formed in the lead frame strip at the same time that the finger projections are created.

A number of ceramic base carriers are then metalized similarly to carrier 11 shown in FIG. 1. The preferred ceramic material is beryllia, the preferred metalization material is moly-manganese and a nickel overcoat is applied over the moly-manganese material. The process of metalizing the individual beryllia carriers is preferably done while the carriers are part of a large beryllia substrate which is subsequently scribed and broken into many individual carriers. The lead frame strip 34 is then aligned with a number of individual metalized ceramic carriers and each ceramic carrier is then bonded to the lead frame strip as generally indicated in FIG. 5.

The combined lead frame strip and carrier assembly then undergoes a cutting process whereby the finger projections 17 and 18 are isolated mechanically and electrically from the lead frame strip. The lead frame strip assembly 40 is held intact by maintaining the electrical and mechanical connection of projections 19 of the lead frame strip as shown in FIG. 7. The lead frame strip 34 and the bonded metalization areas on each individual carrier are then gold plated as shown in FIG. 7. While gold electroplating is preferred, any gold coating operation is included by the term plating. Thus only a single gold plating operation is involved. The gold plating operation is required because a silicon-gold eutectic is to be formed when mounting silicon semiconductor chips on the ceramic carrier and also gold plating provides a suitable surface for wire bonding connections while providing a non-corroding solderable surface. The back side metalization of the ceramic carriers is not contemplated as being gold plated since this area of the carrier is to be soldered directly to a heat sink.

A semiconductor chip device 22 is mounted on each of the ceramic carriers after the gold plating step as shown in FIG. 8. The electrical terminals of the semiconductor device are coupled to appropriate finger projections of lead frame strip 34 by standard wire bonding techniques or the like. In the preferred embodiment an MOS capacitor 23 is also mounted on each ceramic carrier and is coupled to finger projections also by standard bonding techniques as shown and described previously.

In the preferred embodiment the semiconductor devices are mounted and attached to the lead frame strip assembly such that projecting members 17 correspond to the collector leads of a single semiconductor device, projecting members 18 are coupled through an MOS capacitor 23 to the base of each semiconductor device and finger projections 19 are bonded to correspond to the emitters of the individual semiconductor devices. Thus projections 17 and 18, which are isolated from the lead frame strip 34 (as shown in FIG. 8), represent the input and output leads of a semiconductor device and projection member 19 represents the common emitter lead to a number of devices.

By probing the base and collector leads (17 and 18) of each individual ceramic carrier and making a single connection to the emitter lead (19) which is in common with all devices attached to the carrier strip, it is possible to electrically test all devices attached to carrier strip 34 (shown in FIG. 8) while the devices are still in a strip form assembly. Thus a minimum of individual handling is required in the entire process even through the step of electrically testing individual semiconductor devices.

A small, inexpensive, semiconductor carrier package which reduces the amount of lead inductance error that may be encountered when a semiconductor device is mounted relative to a hybrid substrate has been disclosed. A method for manufacturing the inventive semiconductor device package which includes only a single gold metalizing step and which also provides for the individual testing of semiconductor devices while the devices are still in strip form has also been disclosed.

While I have shown and described a specific embodiment of this invention, further modifications and improvements will occur to those skilled in the art. All modifications which retain the basic underlying principles disclosed and claimed herein are within the scope of this invention.

I claim:

1. A power semiconductor package for use in hybrid power assemblies comprising:
    a ceramic base having a top surface, a flat bottom surface parallel to said top surface, and a thickness;

a solderable electrically and thermally conductive bottom metalization bonded to and substantially covering all of said bottom ceramic surface;

an electrically conductive top metalization bonded to said top ceramic surface and forming a plurality of top metalized areas each of said plurality of metalized areas being isolated from each other;

a plurality of flat metal leads bonded to said plurality of top metalized areas, each of said leads including a portion contacting at least one of said top metalized areas, a projection of a first width extending from said contacting portion outward and substantially beyond the edge of said ceramic base, and a further outward extension having a second narrower width; and a semiconductor chip mechanically mounted to said ceramic top surface and electrically coupled to said plurality of top metalized areas.

2. The power semiconductor package according to claim 1 wherein said plurality of top metalized areas consists of three metalized areas and wherein said bottom surface metalization is electrically isolated from each of said plurality of top metalized areas.

3. The package according to claim 2 wherein said semiconductor chip is a high frequency power transistor chip.

4. The package according to claim 3 wherein an MOS capacitor is additionally mechanically mounted to said ceramic top surface.

5. The package according to claim 3 wherein exposed portions of said top metalized areas and said metal leads have an outer gold surface.

6. The package according to claim 3 wherein said top surface is rectangular in shape.

7. A hybrid power assembly comprising:

a heat sink;

a ceramic substrate mounted to said heat sink, said substrate having an internal opening and a plurality of metalized areas; and a semiconductor package, having at least two flat metal leads and a ceramic base, said base mounted directly to said heat sink and located within said internal opening;

said two leads attached to said base and having projections of a first width extending outward and substantially beyond the edge of said base, said leads including further outward extensions having a second narrower width, said narrower width extensions of said leads being bonded to said metalized areas on said substrate.

8. The assembly according to claim 7 wherein said ceramic base and said internal opening are generally rectangular in shape.

* * * * *